United States Patent
Koba et al.

(10) Patent No.: US 9,995,792 B2
(45) Date of Patent: Jun. 12, 2018

(54) BATTERY STATE DETERMINATION DEVICE DETERMINING A MICRO-SHORT-CIRCUITING TENDENCY OF A RECHARGEABLE BATTERY

(71) Applicants: PRIMEARTH EV ENERGY CO., LTD., Kosai-shi, Shizuoka (JP); TOYOTA JIDOSHA KABUSHIKI KAISHA, Toyoto-shi, Aichi-ken (JP)

(72) Inventors: Daisuke Koba, Toyohashi (JP); Sachio Takeda, Toyohashi (JP); Koichi Ichikawa, Kasugai (JP); Yasuhiro Takahashi, Miyoshi (JP); Masahiko Mitsui, Toyota (JP)

(73) Assignees: PRIMEARTH EV ENERGY CO., LTD., Kosai-Shi (JP); TOYOTA JIDOSHA KABUSHIKI KAISHA, Toyota-Shi (JP)

( * ) Notice: Subject to any disclaimer, the term of this patent is extended or adjusted under 35 U.S.C. 154(b) by 424 days.

(21) Appl. No.: 14/782,788

(22) PCT Filed: Mar. 5, 2014

(86) PCT No.: PCT/JP2014/055545
§ 371 (c)(1),
(2) Date: Oct. 6, 2015

(87) PCT Pub. No.: WO2014/167920
PCT Pub. Date: Oct. 16, 2014

(65) Prior Publication Data
US 2016/0061907 A1 Mar. 3, 2016

(30) Foreign Application Priority Data
Apr. 12, 2013 (JP) .................. 2013-083789

(51) Int. Cl.
*G01R 31/36* (2006.01)
*H01M 10/48* (2006.01)
(Continued)

(52) U.S. Cl.
CPC ....... *G01R 31/3662* (2013.01); *G01R 31/025* (2013.01); *H01M 10/48* (2013.01); *G01R 31/3679* (2013.01); *H02J 7/0021* (2013.01)

(58) Field of Classification Search
CPC .............. G01R 31/025; G01R 31/3662; G01R 31/3679; H01M 10/48; H01M 6/50; H01M 6/52; H02J 7/0021; H02J 7/00
(Continued)

(56) References Cited

U.S. PATENT DOCUMENTS

| 2009/0099802 A1 | 4/2009 | Barsoukov et al. |
| 2010/0151341 A1* | 6/2010 | Manabe ............ H01M 8/04089 429/431 |

(Continued)

FOREIGN PATENT DOCUMENTS

| CN | 2569158 Y | 8/2003 |
| CN | 102590623 A | 7/2012 |

(Continued)

OTHER PUBLICATIONS

Hong-xia1 et al., "Fast determination of micro short circuit in sintered MH-Ni battery", Journal of Power Sources, vol. 34, Issue 6, Jun. 2010, pp. 608-609.

(Continued)

*Primary Examiner* — Jay Patidar
(74) *Attorney, Agent, or Firm* — Maschoff Brennan (57) ABSTRACT

A battery state determination device, which determines a micro-short-circuiting tendency state, includes an impedance meter that applies an AC voltage or an AC current of a measurement frequency to a rechargeable battery, which is (Continued)

subject to determination, and measures complex impedance. The device further includes a detector that detects an absolute value of an imaginary axis component of the complex impedance. The device further includes a determiner that compares the absolute value of the imaginary axis component detected by the detector with a lower limit threshold value. The lower limit threshold value is set based on a measurement result of the absolute value of the imaginary axis component of the rechargeable battery in the micro-short-circuiting tendency state. When the absolute value of the imaginary axis component is smaller than the lower limit threshold value, the determiner determines that the rechargeable battery is in the micro-short-circuiting tendency state.

7 Claims, 4 Drawing Sheets

(51) Int. Cl.
  *G01R 31/02* (2006.01)
  *H02J 7/00* (2006.01)
(58) Field of Classification Search
  USPC .......................................................... 324/430
  See application file for complete search history.

(56) References Cited

U.S. PATENT DOCUMENTS

| | | |
|---|---|---|
| 2012/0182020 A1 | 7/2012 | Akutsu et al. |
| 2014/0218042 A1* | 8/2014 | Koba ................. G01R 31/3651 324/430 |

FOREIGN PATENT DOCUMENTS

| | | |
|---|---|---|
| JP | 2000-299137 A | 10/2000 |
| JP | 2003-317810 A | 11/2003 |
| JP | 2011-252930 A | 12/2011 |

OTHER PUBLICATIONS

Santhanagopalan et al., "Analysis of internal short-circuit in a lithium ion cell", Journal of Power Sources, vol. 194, Issue 1, May 12, 2009, pp. 550-557.

CN Office Action dated Feb. 23, 2017 as received in Application No. 201480019396.2 (English Translation).

* cited by examiner

Fig.8

BATTERY STATE DETERMINATION DEVICE DETERMINING A MICRO-SHORT-CIRCUITING TENDENCY OF A RECHARGEABLE BATTERY

TECHNICAL FIELD

The present invention relates to a battery state determination device that determines a state in which a micro-short circuit has occurred or is highly likely to occur in a rechargeable battery.

BACKGROUND ART

A technique for evaluating the deterioration condition or remaining life of a rechargeable battery by analyzing the complex impedance of the battery has been proposed in the prior art. In this process, the battery state may be evaluated without breaking the battery. Thus, the battery may be reused when it is determined that the battery state is normal.

As an example of the process for analyzing complex impedance, Japanese Laid-Open Patent Publication No. 2000-299137 discloses a process for determining the initial activation degree and the deterioration degree of a rechargeable battery (refer to pp. 20-21 and FIG. 15). In this process, complex impedance is measured by applying an AC voltage of a frequency that is changed in a stepped manner to a rechargeable battery. Then, the real axis component and the imaginary axis component of the impedance are obtained from the measured values. When the values are plotted on a two-dimensional plane, a complex impedance line that includes a curved line and a straight line is obtained. Then, an approximation technique is conducted to obtain a diameter of a generally arc-like portion, which corresponds to the so-called charge transfer resistance region, of the complex impedance line. Then, it is determined whether or not the diameter is smaller than a predetermined threshold value. When the diameter of the generally arc-like portion of the complex impedance is smaller than the predetermined threshold value, it is determined that the initial activation degree of the battery is sufficient. When the diameter is larger than or equal to the predetermined value, it is determined that the initial activation degree is insufficient.

Patent Document 1: Japanese Laid-Open Patent Publication No. 2000-299137

SUMMARY OF THE INVENTION

When a battery is highly likely to have a micro-short circuit or has a micro-short circuit, the battery has a smaller battery capacity than a normal battery. The state of charge (SOC) of such a battery differs from SOC of the normal battery even when discharging in the same manner. In this regard, there is a technique for determining whether or not a micro-short circuit has occurred or is highly likely to occur from the differences in impedance change based on the differences in SOC.

However, when the micro-short circuit is determined from the differences in the impedance change of the charge transfer resistance region, it is difficult to determine whether or not a micro-short circuit has occurred or is highly likely to occur in a battery having impedance that changes a little even when the SOC is changed. This decreases the determination accuracy. Consequently, for example, it may be determined that a non-defective battery, which does not have a micro-short circuit, is a defective product. Examples of such a battery include a nickel-metal hydride battery and a lithium battery having a resistance of 10 m$\Omega$ or less and adapted for in-vehicle use.

It is an object of the present invention to improve the determination accuracy of a battery state determination device that determines whether or not a micro-short circuit has occurred or is highly likely to occur.

One aspect of the present disclosure is a battery state determination device that determines a micro-short-circuiting tendency state of a rechargeable battery. In the micro-short-circuiting tendency state, a micro-short circuit has occurred or is highly likely to occur. The battery state determination device includes an impedance meter, a detector, a memory, and a determiner. The impedance meter applies an AC voltage or an AC current of a measurement frequency to a rechargeable battery, which is subject to determination, and measures complex impedance. The measurement frequency is a frequency that is in correspondence with a diffused resistance region. The detector detects an absolute value of an imaginary axis component of the complex impedance obtained from the impedance meter. The memory stores a lower limit threshold value, which is set based on a measurement result of an absolute value of the imaginary axis component of a rechargeable battery in the micro-short-circuiting tendency state. The determiner compares the absolute value of the imaginary axis component detected by the detector with the lower limit threshold value. When the absolute value of the imaginary axis component is smaller than the lower limit threshold value, the determiner determines that the rechargeable battery, which is subject to determination, is in the micro-short-circuiting tendency state.

According to this embodiment, the complex impedance of the rechargeable battery, which is subject to determination, is measured in the diffused resistance region, and the absolute value of the imaginary axis component is used as a parameter for determining the micro-short-circuiting tendency state. The diffused resistance region is a portion of a complex impedance curve that appears at the low frequency side. In a rechargeable battery in the micro-short-circuiting tendency state, the impedance change is significant in the diffused resistance region. Thus, comparison of the absolute value of the detected imaginary axis component with the predetermined lower limit threshold value improves the accuracy for determining the micro-short-circuiting tendency state. In particular, the absolute value of the imaginary axis component is a parameter that most reflects the micro-short-circuiting tendency. This relatively decreases measurement errors. Thus, even when the micro-short-circuiting tendency state is difficult to be detected using other parameters in a battery, the micro-short-circuiting tendency state of such a battery may be detected in a non-destructive manner.

In one embodiment, the impedance meter measures the complex impedance of the rechargeable battery when a state of charge is less than or equal to 20%.

More specifically, the complex impedance of a rechargeable battery in a micro-short-circuiting tendency state is greatly changed as the state of charge (SOC) of the rechargeable battery approaches "zero". In the above battery state determination device, the complex impedance is measured when the state of charge is less than or equal to 20%. This improves the accuracy for detecting a micro-short circuit and eliminates the need to fully recharge the rechargeable battery for determination.

In one embodiment, the detector calculates an absolute value of a real axis component of the complex impedance together with the absolute value of the imaginary axis component. The memory stores a second lower limit threshold value, which is set based on a measurement result of an absolute value of the real axis component of the rechargeable battery that is in the micro-short-circuiting tendency state, together with a first lower limit threshold value, which corresponds to the absolute value of the imaginary axis component. When the absolute value of the imaginary axis component of the rechargeable battery, which is subject to determination, is smaller than the first lower limit threshold value or the absolute value of the real axis component of the rechargeable battery, which is subject to determination, is smaller than the second lower limit threshold value, the determiner determines that the rechargeable battery, which is subject to determination, is in the micro-short-circuiting tendency state.

According to this embodiment, in addition to the absolute value of the imaginary axis component of the complex impedance, the absolute value of the real axis component is used as a parameter for determining the micro-short-circuiting tendency state. The absolute values of the detected imaginary axis component and real axis component are compared with the corresponding lower limit threshold values. This improves the accuracy for determining the micro-short-circuiting tendency state.

Another aspect of the present disclosure is a battery state determination device that determines a micro-short-circuiting tendency state of a rechargeable battery. In the micro-short-circuiting tendency state, a micro-short circuit has occurred or is highly likely to occur. The battery state determination device includes an impedance meter, a detector, a memory, and a determiner. The impedance meter applies an AC voltage or an AC current of a measurement frequency to a rechargeable battery, which is subject to determination, and measures complex impedance. The measurement frequency is a frequency that is in correspondence with a diffused resistance region. The detector detects an absolute value of a real axis component of the complex impedance obtained from the impedance meter. The memory stores a lower limit threshold value, which is set based on a measurement result of the real axis component of a rechargeable battery in the micro-short-circuiting tendency state. The determiner compares the absolute value of the real axis component detected by the detector with the lower limit threshold value. When the absolute value of the real axis component is smaller than the lower limit threshold value, the determiner determines that the rechargeable battery, which is subject to determination, is in the micro-short-circuiting tendency state.

According to this embodiment, the complex impedance of the rechargeable battery, which is subject to determination, is measured in the diffused resistance region, and the absolute value of the real axis component is used as a parameter for determining the micro-short-circuiting tendency state. The diffused resistance region is a portion of a complex impedance curve that appears at the low frequency side. In a rechargeable battery in the micro-short-circuiting tendency state, the impedance change is significant in the diffused resistance region. Hence, comparison of the absolute value of the detected real axis component with the predetermined lower limit threshold value improves the accuracy for determining the micro-short-circuiting tendency state. Thus, even when the micro-short-circuiting tendency state is difficult to be detected using other parameters in a battery, the micro-short-circuiting tendency state of such a battery may be detected in a non-destructive manner.

Another aspect of the present disclosure is a battery state determination device that determines a micro-short-circuiting tendency state of a rechargeable battery. In the micro-short-circuiting tendency state, a micro-short circuit has occurred or is highly likely to occur. The battery state determination device includes an impedance meter, a detector, a memory, and a determiner. The impedance meter applies an AC voltage or an AC current of a measurement frequency to a rechargeable battery, which is subject to determination, and measures complex impedance. The measurement frequency is a frequency that is in correspondence with a diffused resistance region. The detector detects an absolute value of the complex impedance obtained from the impedance meter. The memory stores a lower limit threshold value, which is set based on a measurement result of the complex impedance of a rechargeable battery in the micro-short-circuiting tendency state. The determiner compares the absolute value of the complex impedance detected by the detector with the lower limit threshold value. When the absolute value of the complex impedance is smaller than the lower limit threshold value, the determiner determines that the rechargeable battery, which is subject to determination, is in the micro-short-circuiting tendency state.

According to this embodiment, the complex impedance of the rechargeable battery, which is subject to determination, is measured in the diffused resistance region, and the absolute value of the complex impedance is used as a parameter for determining the micro-short-circuiting tendency state. The diffused resistance region is a portion of a complex impedance curve that appears at the low frequency side. In a rechargeable battery in the micro-short-circuiting tendency state, the impedance change is significant in the diffused resistance region. Hence, comparison of the absolute value of the detected complex impedance with the predetermined lower limit threshold value improves the accuracy for determining the micro-short-circuiting tendency state. Thus, even when the micro-short-circuiting tendency state is difficult to be detected using other parameters in a battery, the micro-short-circuiting tendency state of such a battery may be detected in a non-destructive manner.

In one embodiment, the impedance meter measures the complex impedance of the rechargeable battery when a state of charge is less than or equal to 20%.

More specifically, the complex impedance of a rechargeable battery in a micro-short-circuiting tendency state is greatly changed as the state of charge (SOC) of the rechargeable battery approaches "zero". In the above battery state determination device, the complex impedance is measured when the state of charge is less than or equal to 20%. This improves the accuracy for detecting a micro-short circuit and eliminates the need to fully recharge the rechargeable battery for determination.

Other aspects and advantages of the present disclosure will become apparent from the following description, taken in conjunction with the accompanying drawings, illustrating by way of example the principles of the disclosure.

BRIEF DESCRIPTION OF THE DRAWINGS

Novel features of the present disclosure will become apparent from the accompanying claims. The disclosure, together with objects and advantages thereof, may best be understood by reference to the following description of the presently preferred embodiments together with the accompanying drawings.

DESCRIPTION OF THE EMBODIMENTS OF THE INVENTION

First Embodiment

A first embodiment of a battery state determination device will now be described. The device determines whether or not a rechargeable battery is in a state (micro-short-circuiting tendency state) in which a micro-short circuit has occurred or a micro-short circuit is highly likely to occur. The rechargeable battery is, for example, a lithium-ion battery or a nickel-metal hydride battery that is adapted for in-vehicle use and has a resistance of 10 mΩ or less. The micro-short circuit refers to a micro-short circuit that occurs due to a small deposit, entrance of a fine foreign material, or the like in the battery. The formation of a micro-short circuit may not immediately lead the battery to an unusable state. Although a micro-short circuit may be instantaneously burned out when a small current flows to the shorted location, the micro-short circuit may deteriorate the battery performance or cause an internal short-circuit.

Figure 1:
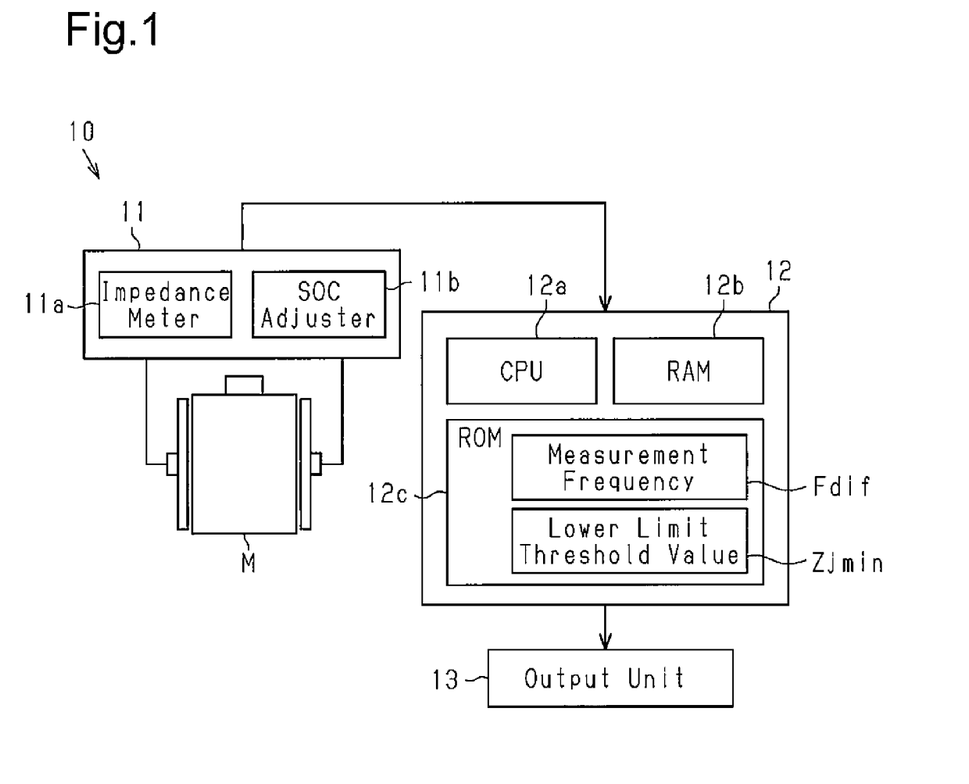
FIG. 1 is a schematic diagram illustrating a first embodiment of a battery state determination device according to the present invention.

As illustrated in FIG. 1, a battery state determination device 10 includes a measurement unit 11 and a determination unit 12. The measurement unit 11 includes an impedance meter 11a and an SOC adjuster 11b. The impedance meter 11a applies an AC voltage or an AC current to a battery module M, which is subject to determination, and measures complex impedance of the battery module M, which functions as a rechargeable battery. The SOC adjuster 11b adjusts the state of charge (SOC) of the battery module M. In the present embodiment, the battery module M includes a plurality of battery cells. A plurality of battery modules M are combined together to form a battery stack. The battery stack, an ECU, and the like form a battery pack that is mounted on a vehicle or the like.

The determination unit 12 includes a CPU 12a, a RAM 12b, a ROM 12c, and the like. The ROM 12c stores a program used for determining the micro-short-circuiting tendency state. A determination result of the determination unit 12 is provided for an output unit 13 such as a display or a printer. The determination unit 12 includes a detector, a memory, and a determiner.

The determination unit 12 receives a measured value of the complex impedance from the measurement unit 11. The ROM 12c of the determination unit 12 stores a measurement frequency Fdif and a lower limit threshold value Zjmin that are set for the battery module M, which is subject to determination, through experiments or the like. The measurement frequency Fdif and the lower limit threshold value Zjmin vary in accordance with battery types such as a nickel-metal hydride battery and a lithium battery. Additionally, even when the battery type is the same, the measurement frequency Fdif and the lower limit threshold value Zjmin vary if the number of cells, the capacity, or the like differs. Therefore, when the type or the structure of the battery, which is subject to determination, varies, the measurement frequency Fdif and the lower limit threshold value Zjmin are set in correspondence with the determination subject.

The complex impedance Z of the battery module M is expressed by a real axis component Zreal, which is a vector component, and an imaginary axis component Zimg as follows. Here, "j" is a unit of the imaginary axis.

$$Z = Zreal + jZimg$$

Figure 2:
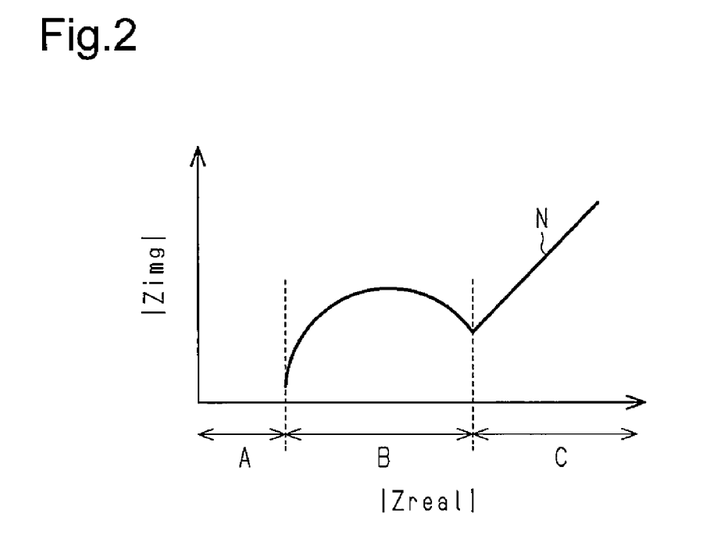
FIG. 2 is a graph illustrating complex impedance measured by the device.

FIG. 2 illustrates a schematic complex impedance curve N obtained by plotting values of the real axis components and the imaginary axis components of the complex impedance in a two-dimensional plane. The complex impedance curve N is measured as changing the frequency of the AC voltage (or AC current), which is applied to the battery module M. The horizontal axis corresponds to the absolute value (|Zreal|) of the real axis component Zreal, and the vertical axis corresponds to the absolute value (|Zimg|) of the imaginary axis component Zimg.

The complex impedance curve N may be divided, from the high frequency side, into a part liquid resistance region A, an arc-like charge transfer resistance region B, and a diffused resistance region C, which has the form of a generally straight line. In the part liquid resistance region A, a contact resistance is formed by active substances or a current collector, resistance is formed when ions move in the electrolyte contained in separators, and the like. In the charge transfer resistance region B, resistance is formed due to movement of charges and the like. In the diffused resistance region C, impedance is formed due to the diffusion of substances.

The measurement frequency Fdif is a predetermined frequency that is within the frequency range corresponding to the diffused resistance region C. The measurement frequency Fdif is set to the frequency that is in correspondence with the diffused resistance region C because the impedance change of the battery module M in a micro-short-circuiting tendency state is significant in the diffused resistance region C compared to the other regions A, B. To determine the micro-short-circuiting tendency state, the AC voltage or AC current of the measurement frequency Fdif is applied to the battery module M.

The lower limit threshold value Zjmin indicates the lower limit of the value of the imaginary axis components of the complex impedance. It is determined that a battery module M having an absolute value of a measured imaginary axis component that is smaller than the lower limit threshold value Zjmin be a defective product, which is in the micro-short-circuiting tendency state.

A specific value of the lower limit threshold value Zjmin is set as follows. For example, a couple of hundreds of battery modules M are inspection subjects. When the AC voltage of the measurement frequency Fdif is applied to each battery module M, the measurement unit 11 or the like measures the imaginary axis component Zimg of the complex impedance. Here, the imaginary axis component Zimg is measured rather than the real axis component Zreal because the real axis component Zreal is reflected by not only the micro-short-circuiting tendency but also abnormality due to increases in the liquid resistance and component resistance while the imaginary axis component Zimg is most reflected by the micro-short-circuiting tendency.

After the imaginary axis component Zimg of each battery module M is measured, a known process such as a teardown analysis is conducted to determine whether or not the battery module M has the micro-short circuit and the micro-short circuit is likely to occur.

Figure 3:
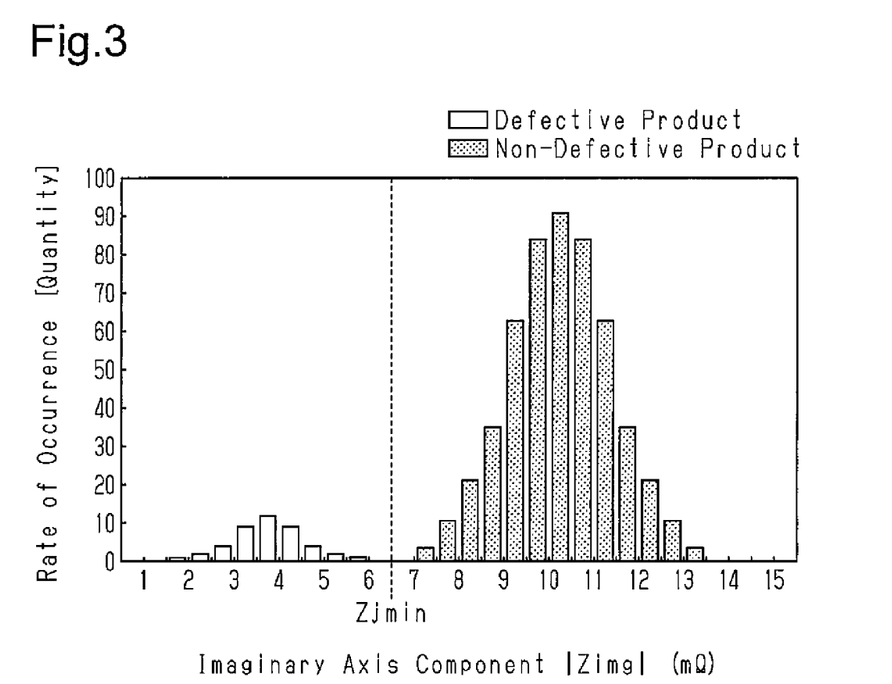
FIG. 3 is a distribution chart illustrating the relationship between complex impedance and distributions of non-defective products and defective products that undergo the determination of the embodiment.

FIG. 3 illustrates a distribution chart illustrating the imaginary axis component Zimg obtained when the AC voltage of the measurement frequency Fdif is applied to each battery module M. In FIG. 3, the horizontal axis corresponds to the absolute value of the imaginary axis component Zimg, and the vertical axis corresponds to the number of the battery modules M. In the distribution chart of FIG. 3, defective products are distributed in a region in which the absolute value of the imaginary axis component Zimg is smaller than 6.0 mΩ, and non-defective products are distributed in a region in which the absolute value of the imaginary axis component Zimg is larger than or equal to 6.0 mΩ. Thus, 6.0 mΩ, which is the boundary of non-defective products and defective products, is set to the lower limit threshold value Zjmin. Here, in the distribution chart, no clear boundary of non-defective products and defective products may be observed and there may be a region where non-defective products are mixed with defective products. In such a case, the lower limit threshold value Zjmin may be set to the maximum value of the mixed region or a value at which the number of non-defective products becomes greater than the number of defective products in the mixed region.

Figure 4:
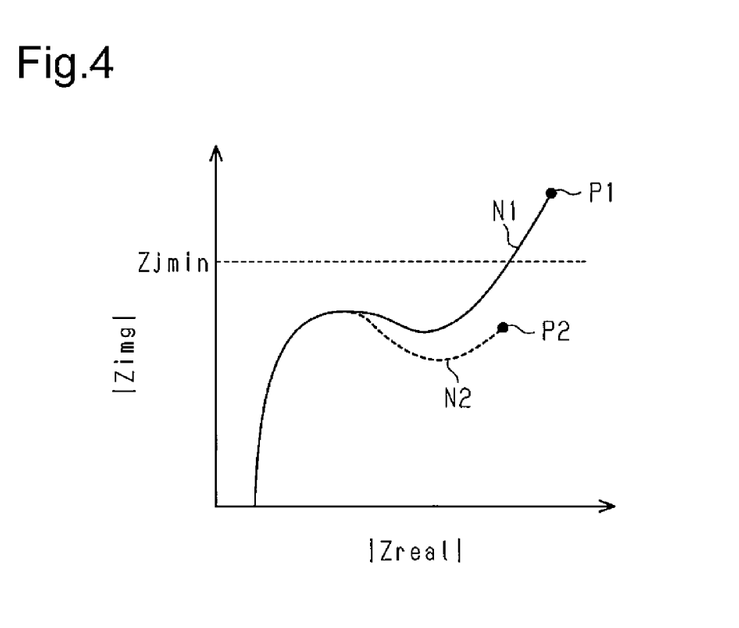
FIG. 4 is a graph of complex impedance illustrating a determination process of the embodiment.

FIG. 4 illustrates the complex impedance curve N1 of a non-defective product and the complex impedance curve N2 of a defective product. The curves N1, N2 are measured by applying the AC voltage, the frequency of which is varied, to a non-defective product and a defective product of the battery modules M, each of which has a low SOC. In the curve N1 of a non-defective product, which is not in a micro-short-circuiting tendency state, the absolute value |Zimg| of the imaginary axis component exceeds the lower limit threshold value Zjmin at the point P1 that corresponds to the measurement frequency Fdif. In contrast, in the curve N1 of a defective product, which is in a micro-short-circuiting tendency state, the absolute value |Zimg| of the imaginary axis component is smaller than the lower limit threshold value Zjmin at the point P2 that corresponds to the measurement frequency Fdif. When the battery module M includes only a single battery cell in a micro-short-circuiting tendency state, the absolute value of the imaginary axis component Zimg of the complex impedance of the battery module M is smaller than the lower limit threshold value Zjmin.

(Operation)

The process for determining the micro-short-circuiting tendency state of the present embodiment will now be described. Here, the determination of the micro-short-circuiting tendency state is automatically performed by the battery state determination device 10.

Figure 5:
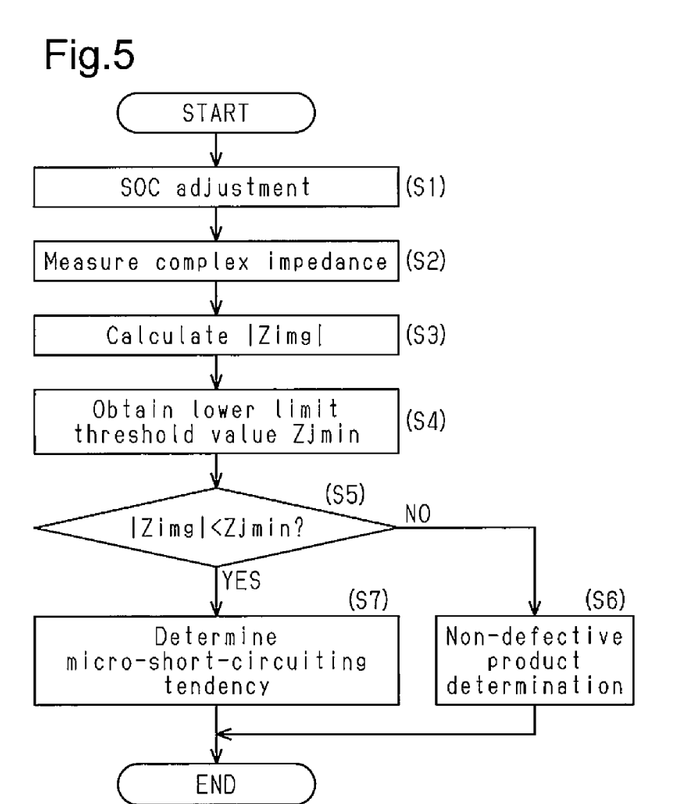
FIG. 5 is a flowchart illustrating the determination process of the embodiment.

As illustrated in FIG. 5, the determination unit 12 performs SOC adjustment on the battery module M by controlling the SOC adjuster 11b of the measurement unit 11 (step S1). The SOC adjuster 11b performs discharging (or charging) of the battery module M to decrease the SOC. More specifically, it is preferred that the SOC of the battery module M is set to be less than or equal to 20%. It is particularly preferred that the SOC of the battery module M is set to be less than or equal to 5%. In such a low SOC state, as illustrated in the impedance curves of FIG. 4, the impedance change is significant compared to a high SOC state. Thus, the state is easily determined. Additionally, when the SOC is less than or equal to 5%, the impedance change is particularly significant and the determination accuracy is further improved.

When the SOC adjustment is performed, the determination unit 12 controls the measurement unit 11 so that the complex impedance of the battery module M is measured by the impedance meter 11a (step S2). At this time, the determination unit 12 controls the measurement unit 11 so that the measurement unit 11 applies the AC voltage of the measurement frequency Fdif, which is stored in the ROM 12c, to the battery module M. Alternatively, the measurement frequency Fdif may be set in the measurement unit 11 in advance. When the measurement frequency Fdif is set at a predetermined value, the measurement time may be shortened compared to when a range of frequencies is set.

When measuring the complex impedance of the battery module M, the impedance meter 11a provides the measured value for the determination unit 12. The determination unit 12 calculates the absolute value (|Zimg|) of the imaginary axis component of the complex impedance based on the measured value (step S3). Also, the determination unit 12 obtains the lower limit threshold value Zjmin from the ROM 12c (step S4). The determination unit 12 determines whether or not the absolute value |Zimg| of the imaginary axis component is smaller than the lower limit threshold value Zjmin (step S5).

When the absolute value |Zimg| of the imaginary axis component is larger than or equal to the lower limit threshold value Zjmin, the determination unit 12 determines that the battery module M, which is subject to determination, is not in a micro-short-circuiting tendency state and gives a non-defective product determination (determines that the battery module M, which is subject to determination, is a non-defective product) (step S6). When the absolute value |Zimg| of the imaginary axis component is smaller than the lower limit threshold value Zjmin, the determination unit 12 determines that the battery module M, which is subject to determination, is a defective product, which is in a micro-short-circuiting tendency state, (step S7).

As described above, the first embodiment has the advantages described below.

(1) In the first embodiment, for the battery module M, which is subject to determination, the complex impedance of the diffused resistance region is measured, and the absolute value |Zimg| of the imaginary axis component of the complex impedance is detected as a parameter for determining the micro-short-circuiting tendency state. The diffused resistance region is a portion of the complex impedance curve N that appears at the low frequency side. When a rechargeable battery is in a micro-short-circuiting tendency state, the impedance change is significant in the diffused resistance region. Thus, comparison of the absolute value |Zimg| of the detected imaginary axis component with the predetermined lower limit threshold value Zjmin detects the battery module M in a micro-short-circuiting tendency state in a relatively accurate manner compared to the prior art. Additionally, in particular, the absolute value |Zimg| of the imaginary axis component is a parameter that most reflects the micro-short-circuiting tendency. This relatively decreases measurement errors. Thus, even when a battery has other parameters that slightly change in a micro-short-circuiting tendency state, the micro-short-circuiting tendency state may be detected in a non-destructive manner.

(2) In the first embodiment, the complex impedance of the battery module M having a micro-short-circuiting tendency largely increases as the state of charge (SOC) of the battery module M approaches "zero". The battery state determination device 10 measures the complex impedance when the state of charge of a rechargeable battery is less than or equal to 20%. This improves the accuracy for detecting a micro-short circuit and eliminates the need to fully recharge the rechargeable battery for determination. When the SOC is less than or equal to 5%, the impedance change is particularly significant. Thus, the determination accuracy is further improved.

Second Embodiment

Figure 6:
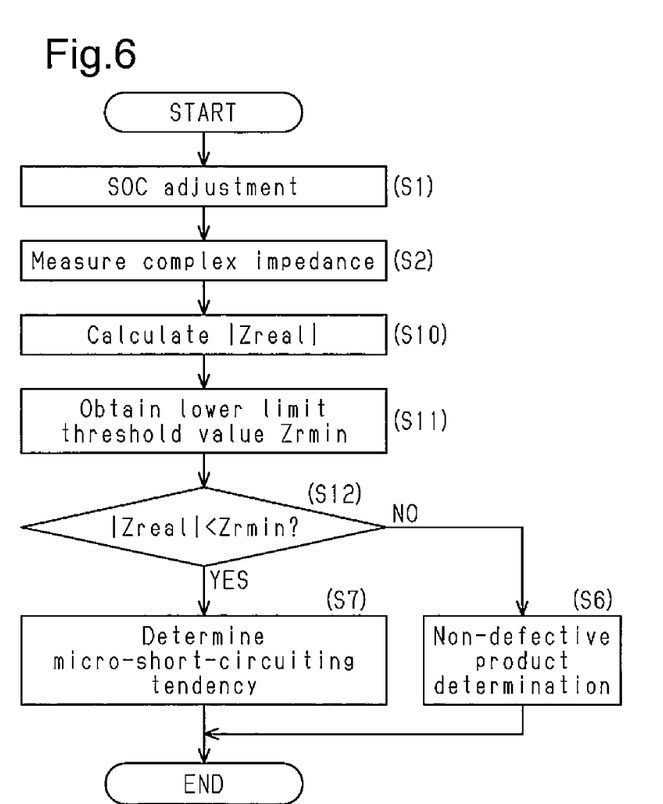
FIG. 6 is a flowchart illustrating the determination process of a second embodiment according to the present invention.

A second embodiment of the present invention will now be described with reference to FIG. 6. The configuration of the second embodiment is changed from that of the first embodiment only in the procedures for the determination process. Thus, the same reference characters are given to those components that are the same as those of the first embodiment. Such components will not be described in detail.

In the present embodiment, the real axis component of the complex impedance is used to determine the micro-short-circuiting tendency state. As described above, the real axis component Zreal is reflected by not only the micro-short-circuiting tendency state but also increases in the liquid resistance, the component resistance, and the like. For example, when determining abnormality including the increases in the liquid resistance, the component resistance, and the like, it is preferred that the real axis component Zreal be used as a parameter for determination.

In this case, a lower limit threshold value Zrmin of the real axis component Zreal is determined in the same manner as the procedures for determining the lower limit threshold value Zjmin of the imaginary axis component Zimg of the first embodiment. More specifically, a couple of hundreds of battery modules M are inspection subjects, the AC voltage of the determination frequency Fdif is applied, and the measurement unit 11 measures the real axis component Zreal of the complex impedance. Then, a known process is conducted to determine whether or not each battery module M has the micro-short circuit and the micro-short circuit is highly likely to occur. Then, a distribution map such as that illustrated in FIG. 3 is formed, and the lower limit threshold value Zrmin, which is the boundary of non-defective products and defective products, is set from the distribution map.

The operation of the battery state determination device 10 of the present embodiment will now be described. The same step numbers are given to those operations that are shared in the present embodiment and the first embodiment. Such operations will not be described in detail. As illustrated in FIG. 6, in the same manner as the first embodiment, the determination unit 12 performs the SOC adjustment on the battery module M by controlling the SOC adjuster 11b of the measurement unit 11 (step S1). The SOC adjuster 11b performs discharging (or charging) of the battery module M to decrease the SOC. More specifically, it is preferred that the SOC of the battery module M is set to be less than or equal to 20%. It is particularly preferred that the SOC of the battery module M be set to less than or equal to 5%. In such a low SOC state, the impedance change is significant compared to a high SOC state. Thus, the state is easily determined. Additionally, when the SOC is less than or equal to 5%, the impedance change is particularly significant and the determination accuracy is further improved.

The determination unit 12 controls the measurement unit 11 so that the complex impedance of the battery module M is measured by the impedance meter 11a (step S2).

When measuring the complex impedance of the battery module M, the impedance meter 11a provides the measured value for the determination unit 12.

The determination unit 12 calculates the absolute value (|Zreal|) of the real axis component of the complex impedance based on the measured value (step S10). The determination unit 12 obtains the lower limit threshold value Zrmin of the absolute value of the real axis component from the ROM 12c (step S11). The determination unit 12 determines whether or not the absolute value |Zreal| of the imaginary real axis component is smaller than the lower limit threshold value Zrmin (step S12).

When the absolute value |Zreal| of the real axis component is larger than or equal to the lower limit threshold value Zrmin, the determination unit 12 determines that the battery module M, which is subject to determination, is not in a micro-short-circuiting tendency state and gives a non-defective product determination (determines that the battery module M, which is subject to determination, is a non-defective product) (step S6). More specifically, when the non-defective product determination is given to the battery module M in step S6, the battery module M is not in a micro-short-circuiting tendency state and is highly likely to be free from abnormality due to increases in the liquid resistance and the component resistant.

When the absolute value |Zreal| of the real axis component is smaller than the lower limit threshold value Zrmin, the determination unit 12 determines that the battery module M, which is subject to determination, is in a micro-short-circuiting tendency state (step S7).

As described above, the second embodiment has the advantages described below in addition to the advantage described in (2) of the first embodiment.

(3) In the second embodiment, in the battery module M, the complex impedance is measured in the diffused resistance region, and the absolute value |Zreal| of the real axis component of the complex impedance is detected as a parameter for determining the micro-short-circuiting tendency state. The diffused resistance region is a portion of the complex impedance curve N that appears at the low frequency side. When the battery module M is in a micro-short-circuiting tendency state, the impedance change is significant in the diffused resistance region. Thus, comparison of the absolute value |Zreal| of the detected real axis component with the predetermined lower limit threshold value Zrmin improves the accuracy for determining the micro-short-circuiting tendency state. Thus, even when a battery has other parameters that slightly change in a micro-short-circuiting tendency state, the micro-short-circuiting tendency state may be detected in a non-destructive manner.

Third Embodiment

Figure 7:
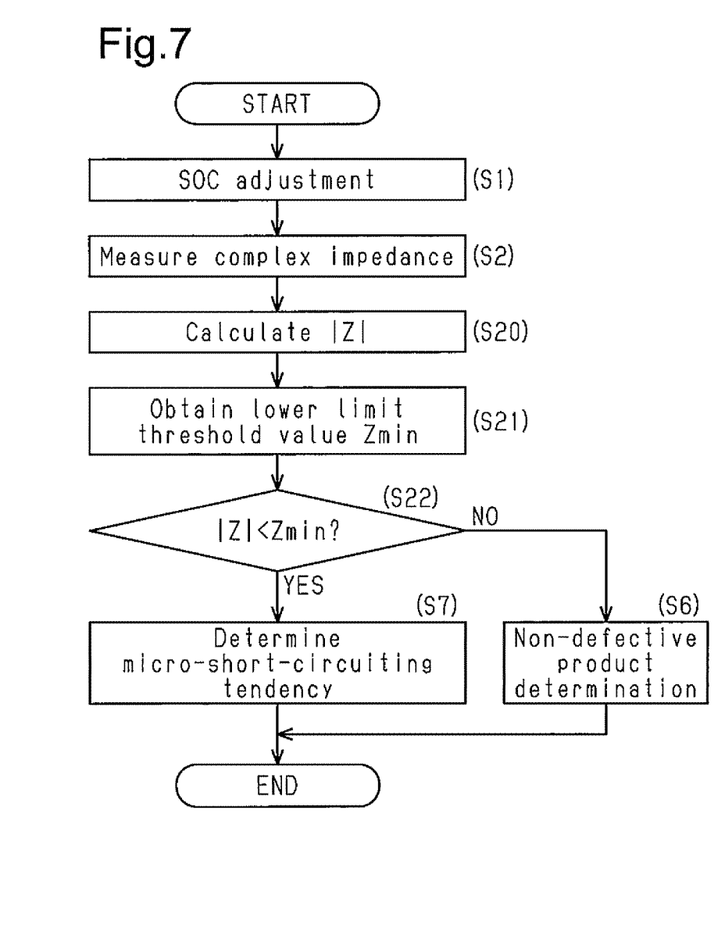
FIG. 7 is a flowchart illustrating the determination process of a third embodiment according to the present invention.

A third embodiment of the present invention will now be described with reference to FIG. 7. The configuration of the third embodiment is changed from that of the first embodiment only in the procedures for the determination process.

In the present embodiment, an absolute value (|Z|) of the complex impedance is used to determine the micro-short-circuiting tendency state. Here, |Z| is expressed as follows.

$$|Z| = \{(Zimg)^2 + (Zreal)^2\}^{1/2}$$

Thus, the absolute value |Z| of the complex impedance includes the real axis component Zreal. For example, when determining the state including increases in the liquid resistance, the component resistance, and the like, it is preferred that the real axis component Zreal be used as a parameter for determination. The determination using the absolute value |Z| of the complex impedance, which includes the imaginary axis component Zimg, improves the accuracy for determining the micro-short-circuiting tendency state.

In the present embodiment, a lower limit threshold value Zmin is set through the same process as that of the first embodiment. More specifically, the process differs from that of the first embodiment only in that the absolute value |Z| of the complex impedance is the parameter for the horizontal axis in the distribution map described above.

The operation of the battery state determination device 10 of the present embodiment will now be described. The same step numbers are given to those operations that are shared in the present embodiment and the first embodiment. Such operations will not be described in detail. As illustrated in FIG. 7, in the same manner as the first embodiment and the second embodiment, the determination unit 12 performs the SOC adjustment on the battery module M (step S1). At this time, the SOC adjuster 11b performs discharging (or charging) of the battery module M to decrease the SOC. More specifically, it is preferred that the SOC of the battery module M is set to be less than or equal to 20%. It is particularly preferred that the SOC of the battery module M be set to less than or equal to 5%. In such a low SOC state, the impedance change is significant compared to a high SOC state. Thus, the state is easily determined. Additionally, when the SOC is less than or equal to 5%, the impedance change is particularly significant and the determination accuracy is further improved.

The determination unit 12 measures the complex impedance of the battery module M using the impedance meter 11a (step S2).

The determination unit 12 calculates the absolute value (|Z|) of the complex impedance based on the value measured by the impedance meter 11a (step S20). The determination unit 12 obtains the lower limit threshold value Zmin of the absolute value of the real axis component from the ROM 12c (step S21). The determination unit 12 determines whether or not the absolute value |Z| of the complex impedance is smaller than the lower limit threshold value Zmin (step S22).

When the absolute value |Z| of the complex impedance is larger than or equal to the lower limit threshold value Zmin, the determination unit 12 determines that the battery module M, which is subject to determination, is not in a micro-short-circuiting tendency state and gives a non-defective product determination (determines that the battery module M, which is subject to determination, is a non-defective product) (step S6). When the absolute value |Z| of the complex impedance is smaller than the lower limit threshold value Zmin, the determination unit 12 determines that the battery module M, which is subject to determination, is in a micro-short-circuiting tendency state (step S7).

As described above, the third embodiment has the advantages described below in addition to the advantage described in (2) of the first embodiment.

(4) In the third embodiment, in the battery module M, the complex impedance is measured in the diffused resistance region, and the absolute value |Z| of the complex impedance is detected as a parameter for determining the micro-short-circuiting tendency state. The diffused resistance region is a portion of the complex impedance curve N that appears at the low frequency side. When the battery module M is in a micro-short-circuiting tendency state, the impedance change is significant in the diffused resistance region. Thus, comparison of the absolute value |Z| of the detected complex impedance with the predetermined lower limit threshold value Zmin improves the accuracy for determining the micro-short-circuiting tendency state. Thus, even when a battery has other parameters that slightly change in a micro-short-circuiting tendency state, the micro-short-circuiting tendency state may be detected in a non-destructive manner.

Fourth Embodiment

A fourth embodiment of the present invention will now be described with reference to FIG. 8. The configuration of the fourth embodiment is changed from that of the first embodiment only in the procedures for the determination process.

The operation of the battery state determination device 10 will now be described. The same step numbers are given to those operations that are shared in the present embodiment and the first embodiment. Such operations will not be described in detail. In the present embodiment, the imaginary axis component Zimg and the real axis component Zreal of the complex impedance are used to determine the micro-short-circuiting tendency state. When the imaginary axis component Zimg and the real axis component Zreal are larger than or equal to the set lower limit threshold values Zjmin, Zrmin, respectively, a non-defective product determination is given (it is determined that the battery module M, which is subject to determination, is a non-defective product). The lower limit threshold value Zjmin of the imaginary axis component Zimg is the same as that of the first embodiment. The lower limit threshold value Zrmin of the real axis component Zreal is the same as that of the second embodiment. It is determined that the battery module M is a non-defective product only when the conditions for the imaginary axis component Zimg and the real axis component Zreal are satisfied. This improves the accuracy for determining the micro-short-circuiting tendency state and may evaluate whether or not abnormality occurs due to increases in the liquid resistance, the component resistance, and the like.

Figure 8:
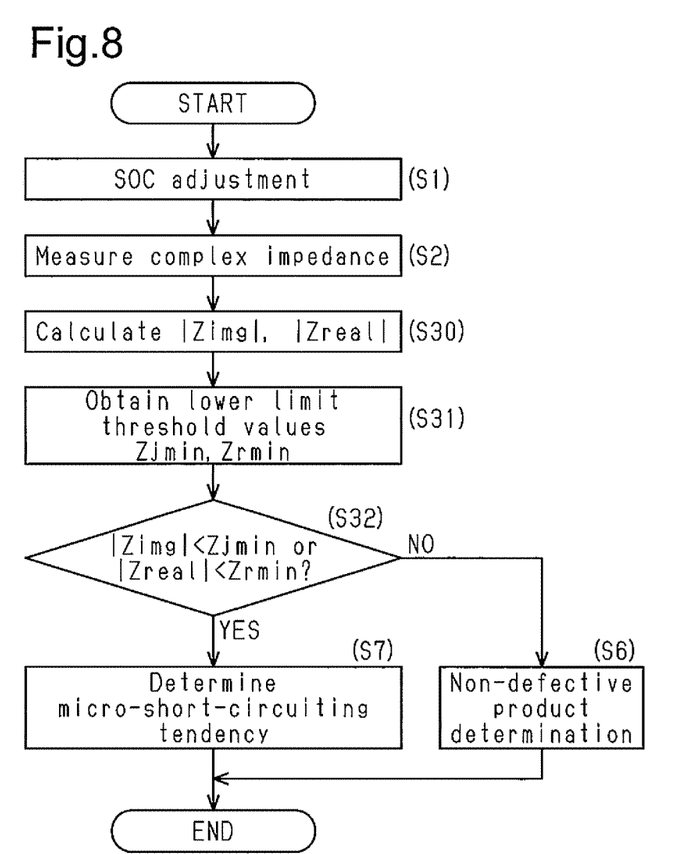
FIG. 8 is a flowchart illustrating the determination process of a fourth embodiment according to the present invention.

As illustrated in FIG. 8, the determination unit 12 performs the SOC adjustment on the battery module M by controlling the measurement unit 11 (step S1). The SOC adjuster 11b performs discharging (or charging) of the battery module M to decrease the SOC. More specifically, it is preferred that the SOC of the battery module M is set to be less than or equal to 20%. It is particularly preferred that the SOC of the battery module M be set to less than or equal to 5%. In such a low SOC state, the impedance change is significant compared to a high SOC state. Thus, the state is easily determined. Additionally, when the SOC is less than or equal to 5%, the impedance change is particularly significant and the determination accuracy is further improved.

The determination unit 12 measures the complex impedance of the battery module M (step S2) and calculates the absolute value |Zimg| of the imaginary axis component and the absolute value |Zreal| of the real axis component of the complex impedance based on the measured value (measured complex impedance) (step S30). In this case, the absolute value |Zimg| of the imaginary axis component and the absolute value |Zreal| of the real axis component are obtained with a single measurement. Thus, the time for determination is not extremely prolonged.

The determination unit 12 obtains the lower limit threshold value Zjmin of the absolute value of the imaginary axis component and the lower limit threshold value Zrmin of the absolute value of the real axis component from the ROM 12c (step S31). The determination unit 12 determines whether or not the absolute value |Zimg| of the imaginary axis component is smaller than the lower limit threshold value Zjmin or the absolute value |Zreal| of the real axis component is smaller than the lower limit threshold value Zrmin (step S32).

When the determination unit 12 determines that the absolute value |Zimg| of the imaginary axis component is larger than or equal to the lower limit threshold value Zjmin and the absolute value |Zreal| of the real axis component is larger than or equal to the lower limit threshold value Zrmin (YES in step S32), it is determined that the battery module M, which is subject to determination, is not in a micro-short-circuiting tendency state, and a non-defective product determination is given (it is determined that the battery module M, which is subject to determination, is a non-defective product) (step S6).

When the absolute value |Zimg| of the imaginary axis component is smaller than the lower limit threshold value Zjmin or the absolute value |Zreal| of the real axis component is smaller than the lower limit threshold value Zrmin (NO in step S32), the determination unit 12 determines that the battery module M is in a micro-short-circuiting tendency state (step S7). That is, the non-defective product determination is given only to the battery module M having the absolute value |Zimg| of the imaginary axis component and the absolute value |Zreal| of the real axis component being larger than or equal to the lower limit threshold values Zjmin, Zrmin, respectively. This limits erroneous determinations of battery modules M being non-defective products when the battery modules M are actually in a micro-short-circuiting tendency state.

As described above, the fourth embodiment has the advantages described below in addition to the advantages described in (1), (2) of the first embodiment.

(5) In the fourth embodiment, the battery state determination device 10 detects the absolute value |Zreal| of the real axis component, in addition to the absolute value |Zimg| of the imaginary axis component of the complex impedance, as parameters for determining the micro-short-circuiting tendency state. When the absolute value |Zimg| is smaller than the lower limit threshold value Zjmin of the imaginary axis component or the absolute value |Zreal| is smaller than the lower limit threshold value Zrmin of the real axis component, the battery state determination device 10 determines the micro-short-circuiting tendency. The battery state determination device 10 gives a non-defective product determination (determines that the battery module M, which is subject to determination, is a non-defective product) only when the absolute values |Zimg|, |Zreal| are larger than or equal to the lower limit threshold values Zjmin, Zrmin, respectively. This limits erroneous determinations of battery modules M being non-defective products when the battery modules M are actually in a micro-short-circuiting tendency state.

The above embodiments may be modified as follows.

In each embodiment, the complex impedance of the battery module M is measured when the SOC is less than or equal to 20%. However, the complex impedance may be measured when the SOC of the battery module M exceeds 20% if the micro-short-circuiting tendency state is detectable even when the SOC of the battery is over 20%.

In each embodiment, the battery module M, which is subject to determination, includes a plurality of battery cells. Instead, a single battery cell may be the determination subject. The determination subject may be a battery stack including a plurality of battery modules M.

In each embodiment, the micro-short-circuiting tendency state of the battery module M is determined using the measurement unit 11 and the determination unit 12. However, the battery state determination device of the present invention is not limited to such a configuration. For example, the SOC adjuster 11b and the impedance meter 11a of the measurement unit 11 may be separate devices.

In each embodiment, the process for calculating an integrated value of the charging current is used as the process for measuring the SOC. However, the process for measuring the SOC is not limited to the process for calculating the integrated value of the charging current. For example, a calculation process based on another parameter such as a voltage value or temperature may be used. Alternatively, a calculation process using a combination of the parameters including the current value may be used.

The invention claimed is:

1. A battery state determination device that determines a micro-short-circuiting tendency state of a rechargeable battery, wherein in the micro-short-circuiting tendency state, a micro-short circuit has occurred or is highly likely to occur, the battery state determination device comprising:
    an impedance meter that applies an AC voltage or an AC current of a measurement frequency to the rechargeable battery, which is subject to determination, and measures complex impedance, wherein the measurement frequency is a frequency that is in correspondence with a diffused resistance region;
    a detector that detects an absolute value of an imaginary axis component of the complex impedance obtained from the impedance meter;
    a memory that stores a lower limit threshold value, wherein the lower limit threshold value is set based on a measurement result of the absolute value of the imaginary axis component of the rechargeable battery in the micro-short-circuiting tendency state; and
    a determiner that compares the absolute value of the imaginary axis component detected by the detector with the lower limit threshold value, wherein when the absolute value of the imaginary axis component is smaller than the lower limit threshold value, the determiner determines that the rechargeable battery, which is subject to determination, is in the micro-short-circuiting tendency state.

2. The battery state determination device according to claim 1, wherein the impedance meter measures the complex impedance of the rechargeable battery when a state of charge is less than or equal to 20%.

3. The battery state determination device according to claim 1, wherein
    the detector calculates an absolute value of a real axis component of the complex impedance together with the absolute value of the imaginary axis component,
    the memory stores a first lower limit threshold value and a second lower limit threshold value, wherein the first lower limit threshold value corresponds to the absolute value of the imaginary axis component, and the second lower limit threshold value is set based on a measurement result of the absolute value of the real axis component of the rechargeable battery that is in the micro-short-circuiting tendency state, and
    when the absolute value of the imaginary axis component of the rechargeable battery, which is subject to determination, is smaller than the first lower limit threshold value or the absolute value of the real axis component of the rechargeable battery, which is subject to determination, is smaller than the second lower limit threshold value, the determiner determines that the rechargeable battery, which is subject to determination, is in the micro-short-circuiting tendency state.

4. A battery state determination device that determines a micro-short-circuiting tendency state of a rechargeable battery, wherein in the micro-short-circuiting tendency state, a micro-short circuit has occurred or is highly likely to occur, the battery state determination device comprising:
   an impedance meter that applies an AC voltage or an AC current of a measurement frequency to the rechargeable battery, which is subject to determination, and measures complex impedance, wherein the measurement frequency is a frequency that is in correspondence with a diffused resistance region;
   a detector that detects an absolute value of a real axis component of the complex impedance obtained from the impedance meter;
   a memory that stores a lower limit threshold value, which is set based on a measurement result of the real axis component of the rechargeable battery in the micro-short-circuiting tendency state; and
   a determiner that compares the absolute value of the real axis component detected by the detector with the lower limit threshold value, wherein when the absolute value of the real axis component is smaller than the lower limit threshold value, the determiner determines that the rechargeable battery, which is subject to determination, is in the micro-short-circuiting tendency state.

5. The battery state determination device according to claim 4, wherein the impedance meter measures the complex impedance of the rechargeable battery when a state of charge is less than or equal to 20%.

6. A battery state determination device that determines a micro-short-circuiting tendency state of a rechargeable battery, wherein in the micro-short-circuiting tendency state, a micro-short circuit has occurred or is highly likely to occur, the battery state determination device comprising:
   an impedance meter that applies an AC voltage or an AC current of a measurement frequency to the rechargeable battery, which is subject to determination, and measures complex impedance, wherein the measurement frequency is a frequency that is in correspondence with a diffused resistance region;
   a detector that detects an absolute value of the complex impedance obtained from the impedance meter;
   a memory that stores a lower limit threshold value, which is set based on a measurement result of the complex impedance of the rechargeable battery in the micro-short-circuiting tendency state; and
   a determiner that compares the absolute value of the complex impedance detected by the detector with the lower limit threshold value, wherein when the absolute value of the complex impedance is smaller than the lower limit threshold value, the determiner determines that the rechargeable battery, which is subject to determination, is in the micro-short-circuiting tendency state.

7. The battery state determination device according to claim 6, wherein the impedance meter measures the complex impedance of the rechargeable battery when a state of charge is less than or equal to 20%.

* * * * *